United States Patent
Saeki et al.

(10) Patent No.: US 9,902,332 B2
(45) Date of Patent: Feb. 27, 2018

(54) ELECTROMAGNETIC WAVE SHIELDING STRUCTURE OF VEHICLE CONSOLE

(71) Applicant: NISSAN MOTOR CO., LTD., Kanagawa (JP)

(72) Inventors: Masayoshi Saeki, Kanagawa (JP); Kouta Terada, Kanagawa (JP); Hideaki Ootsuka, Kanagawa (JP); Akitomo Ootake, Kanagawa (JP)

(73) Assignee: NISSAN MOTOR CO., LTD., Kanagawa (JP)

( * ) Notice: Subject to any disclaimer, the term of this patent is extended or adjusted under 35 U.S.C. 154(b) by 0 days.

(21) Appl. No.: 15/503,384

(22) PCT Filed: Aug. 12, 2014

(86) PCT No.: PCT/JP2014/071310
§ 371 (c)(1),
(2) Date: Feb. 10, 2017

(87) PCT Pub. No.: WO2016/024331
PCT Pub. Date: Feb. 18, 2016

(65) Prior Publication Data
US 2017/0232903 A1    Aug. 17, 2017

(51) Int. Cl.
*B60N 3/12*    (2006.01)
*B60R 7/04*    (2006.01)
*H05K 9/00*    (2006.01)

(52) U.S. Cl.
CPC ............... *B60R 7/04* (2013.01); *H05K 9/002* (2013.01)

(58) Field of Classification Search
CPC ................................. B60R 7/04; H05K 9/002
See application file for complete search history.

(56) References Cited

U.S. PATENT DOCUMENTS 8,953,325 B2 * 2/2015 Yu .................. H05K 7/2039
                                                    165/104.33
9,192,083 B2 * 11/2015 Moon .................. H05K 7/20254
(Continued)

FOREIGN PATENT DOCUMENTS

DE    102012010404 A1    11/2013
JP    H06-199183 A    7/1994
(Continued)

OTHER PUBLICATIONS

International Preliminary Report on Patentability issued in corresponding Application No. PCT/JP2014/071310, dated Feb. 23, 2017 (10 pages).
(Continued)

*Primary Examiner* — Lori L Lyjak
(74) *Attorney, Agent, or Firm* — Osha Liang LLP

(57) ABSTRACT

An electromagnetic wave shielding structure of a console installed in a passenger compartment of a vehicle has an electrical instrument installed in the console from which electromagnetic waves are radiated, a transmission including a metal member that receives the electromagnetic waves and transmits the electromagnetic waves to the passenger compartment and separated by a distance from the electrical instrument, and a shielding member located between the electrical instrument and the transmission to function as a shield against the electromagnetic waves radiated from the electrical instrument. The transmission is located in a shield region defined such that an electromagnetic wave radiating portion provided at the electrical instrument from which the electromagnetic waves are radiated is connected to a circumferential edge of the shielding member via a straight line, and the line is continuously moved along the circumferential edge of the shielding member around the electromagnetic wave radiating portion.

6 Claims, 5 Drawing Sheets

(56) References Cited

U.S. PATENT DOCUMENTS

| | | | |
|---|---|---|---|
| 2010/0089675 A1 | 4/2010 | Nagata et al. | |
| 2013/0163214 A1* | 6/2013 | Lee .................... | H05K 9/002 361/753 |
| 2013/0335941 A1* | 12/2013 | Minaguchi ............. | H05K 9/002 361/818 |

FOREIGN PATENT DOCUMENTS

| | | | |
|---|---|---|---|
| JP | 2002-178313 A | 6/2002 | |
| JP | 2007-106315 A | 4/2007 | |
| JP | 2011-105270 A | 6/2011 | |
| WO | 2008/086089 A1 | 7/2008 | |

OTHER PUBLICATIONS

International Search Report issued in corresponding application No. PCT/JP2014/071310 dated Nov. 4, 2014 (2 pages).

Written Opinion of the International Searching Authority issued in corresponding application No. PCT/JP2014/071310 dated Nov. 4, 2014 (3 pages).

* cited by examiner

ELECTROMAGNETIC WAVE SHIELDING STRUCTURE OF VEHICLE CONSOLE

BACKGROUND

Technical Field

The present invention relates to an electromagnetic wave shielding structure of a vehicle console.

Related Art

Vehicles such as automobiles typically have a problem of electromagnetic waves when radiated from electrical instruments and transmitted to passenger compartments because the electromagnetic waves cause faults such as noise of radios. Thus, development of shielding of electromagnetic waves radiated from electrical instruments is being carried out (for example, refer to Patent Literature 1).

Patent Literature 1 discloses that a power supply that radiates electromagnetic waves is installed behind a rear sheet, and a glass antenna is placed on a front windshield located on the front side of the rear sheet. A grounded metal frame is placed inside the rear sheet.

The electromagnetic waves radiated from the power supply are shielded by the metal frame in the rear sheet, so as to be prevented from reaching the glass antenna on the front windshield.

Patent Literature 1: Japanese Unexamined Patent Application Publication No. 2011-105270

SUMMARY OF INVENTION

The electromagnetic wave shielding structure disclosed in Patent Literature 1 requires the power supply to be located behind the rear sheet. The conventional structure thus has limited arrangement of the power supply radiating the electromagnetic waves.

An electromagnetic wave shielding structure of a vehicle console according to one or more embodiments of the present invention expands the possibility of arrangement of a power supply that radiates electromagnetic waves.

An electromagnetic wave shielding structure of a vehicle console according to one or more embodiments of the present invention includes an electrical instrument that radiates electromagnetic waves, and a transmission including a metal member, wherein a shielding member is located between the electrical instrument and the transmission. The transmission is located in a shield region defined such that a straight line, which connects an electromagnetic wave radiating portion from which the electromagnetic waves are radiated to a circumferential edge of the shielding member, is continuously moved along the circumferential edge of the shielding member around the electromagnetic wave radiating portion.

The electromagnetic waves are transmitted radially from the electromagnetic wave radiating portion of the electrical instrument. If the shielding member is not provided, the electromagnetic waves radiated from the electromagnetic wave radiating portion of the electrical instrument are transmitted to the passenger compartment via the metal member of the transmission, which may cause faults such as noise of a radio.

According to one or more embodiments of the present invention, the shielding member is located between the electrical instrument and the transmission. The transmission is located in the shield region defined such that a straight line, which connects the electromagnetic wave radiating portion to the circumferential edge of the shielding member, is continuously moved along the circumferential edge of the shielding member. Since the shield region is shielded from the electromagnetic waves, the radiation of the electromagnetic waves from the transmission toward the passenger compartment can be prevented efficiently when the transmission is located in the shield region. Accordingly, the possibility of arrangement of the electrical instrument radiating the electromagnetic waves can be expanded.

DETAILED DESCRIPTION

Embodiments of the present invention will be described below. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. As used herein, the sign "FR" denotes the front side of a vehicle, the sign "RR" denotes the back side of the vehicle, the sign "RH" denotes the right side in the vehicle width direction, the sign "LH" denotes the left side in the vehicle width direction, the sign "UPR" denotes the upper side of the vehicle, and the sign "LWR" denotes the lower side of the vehicle.

Figure 1:
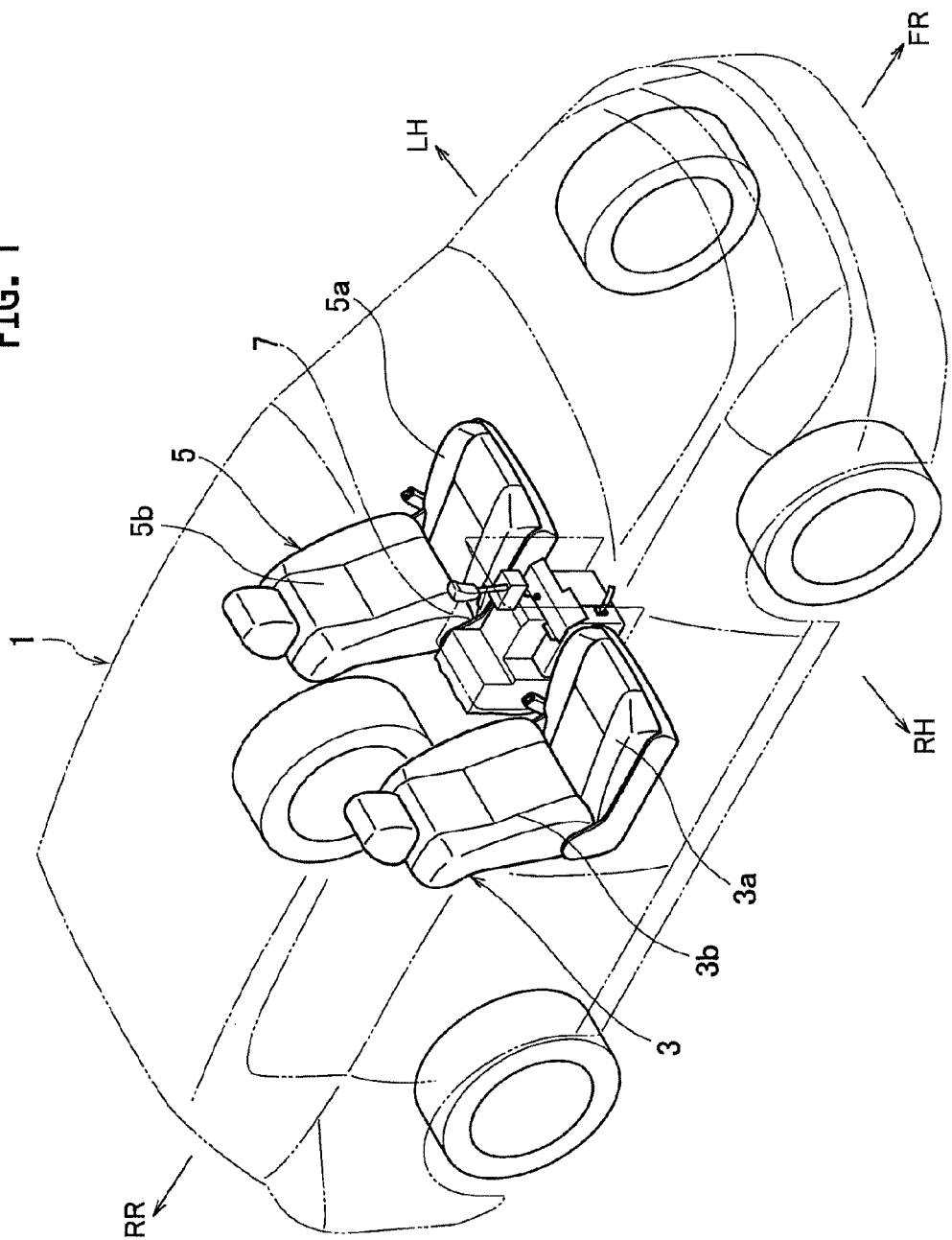
FIG. 1 is a perspective view of an entire vehicle including a console according to one or more embodiments of the present invention.

As shown in FIG. 1, a driver's seat 3 is located on the right and a passenger seat 5 is located on the left on the front side of a passenger compartment of a vehicle 1. The driver's seat 3 includes a seat cushion 3a and a seat back 3b, and the passenger seat 5 includes a seat cushion 5a and a seat back 5b. A console 7 is placed between the driver's seat 3 and the passenger seat 5.

Figure 2:
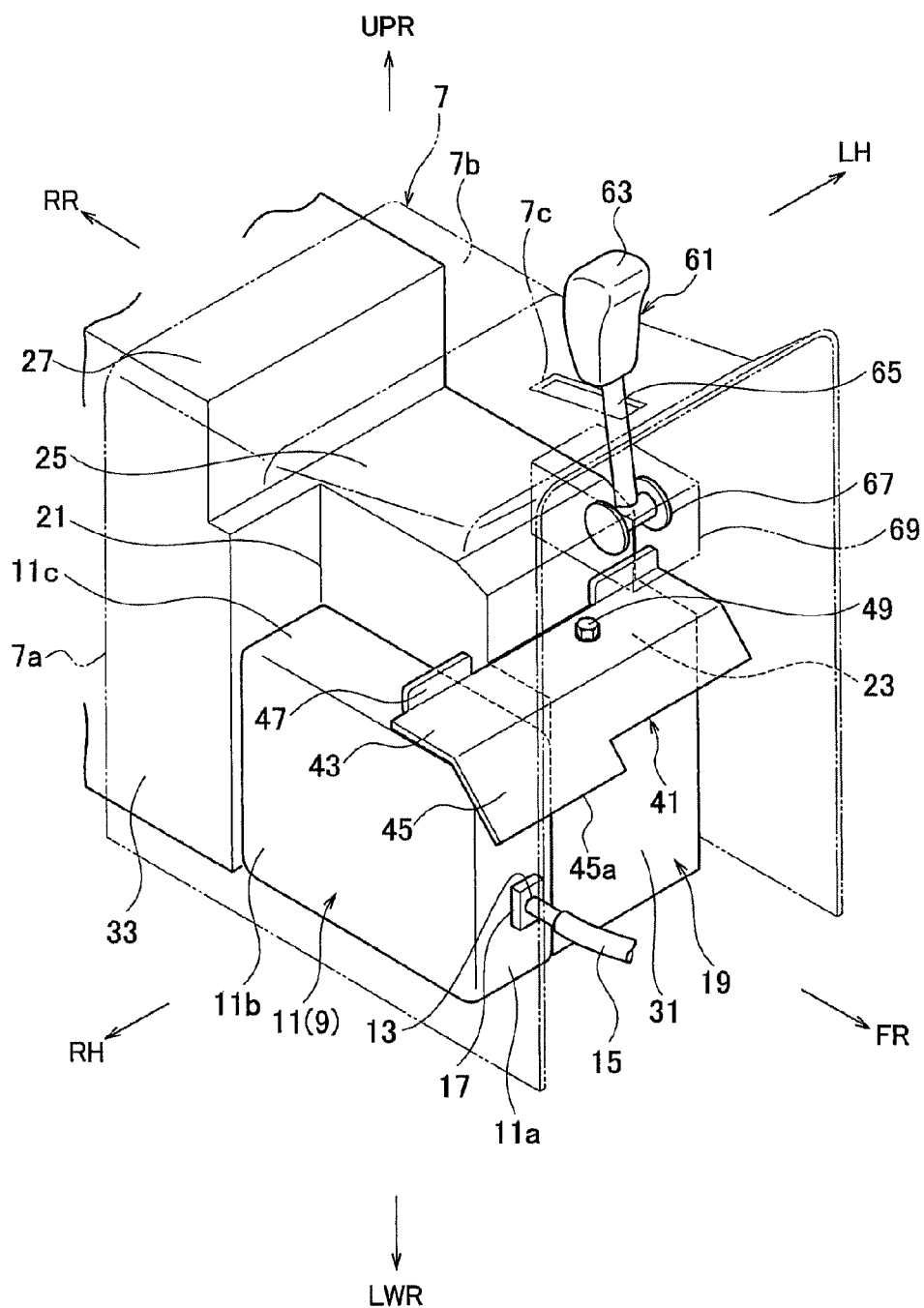
FIG. 2 is an enlarged perspective view of the inside of the console shown in FIG. 1.

As shown in FIG. 1 and FIG. 2, the console 7 is formed of resin into a U-shape in cross section open on the bottom side as viewed from the front side of the vehicle. The console 7 is an integrated member including a pair of right and left side walls 7a and 7a, and an upper wall 7b elongated in the vehicle width direction so as to connect upper edges of the pair of right and left side walls 7a and 7a. The upper wall 7b of the console 7 is provided with a lever hole 7c having a rectangular shape elongated in the vehicle front-rear direction.

The console 7 houses a DC/DC converter 9 (electrical instrument) and a battery 19 placed on the floor in the console 7. In particular, the DC/DC converter 9 is installed on the floor via the battery 19.

The battery 19 is provided with a recessed portion 21 at a corner on the front right side, and the DC/DC converter 9 is located at the recessed portion 21. The upper surface of the battery 19 has three steps in the vertical direction. More particularly, the upper surface of the battery 19 has a first upper surface 23 located on the lowermost side, a second upper surface 25 located higher than the first upper surface 23, and a third upper surface 27 located higher than the second upper surface 25.

A casing 11 of the DC/DC converter 9 (electrical instrument) has a box shape provided with an opening 13 at a lower portion on a front surface 11a, and a cable 15 is inserted into the opening 13. More particularly, a seal member 17 formed of rubber or resin is fitted into the opening 13, and the cable 15 is inserted and fixed to the seal member 17. The DC/DC converter 9 includes a plurality of semiconductor devices (not shown), and turns on/off the plurality of semiconductor devices at short intervals, so as to radiate electromagnetic waves. The electromagnetic waves are radiated (transmitted) to the outside of the casing 11 through the opening 13. In this specification, the opening 13 of the casing 11 serves as an electromagnetic wave radiating portion. The front surface 11a of the casing 11 of the DC/DC converter 9 is arranged on the same plane as a front surface 31 of the battery 19 located on the lower side of the first upper surface 23. A side surface 11b of the casing 11 is arranged at substantially the same position in the vehicle width direction as a side surface 33 of the battery 19. An upper surface 11c of the casing 11 is located lower than the first upper surface 23 of the battery 19.

Figure 3:
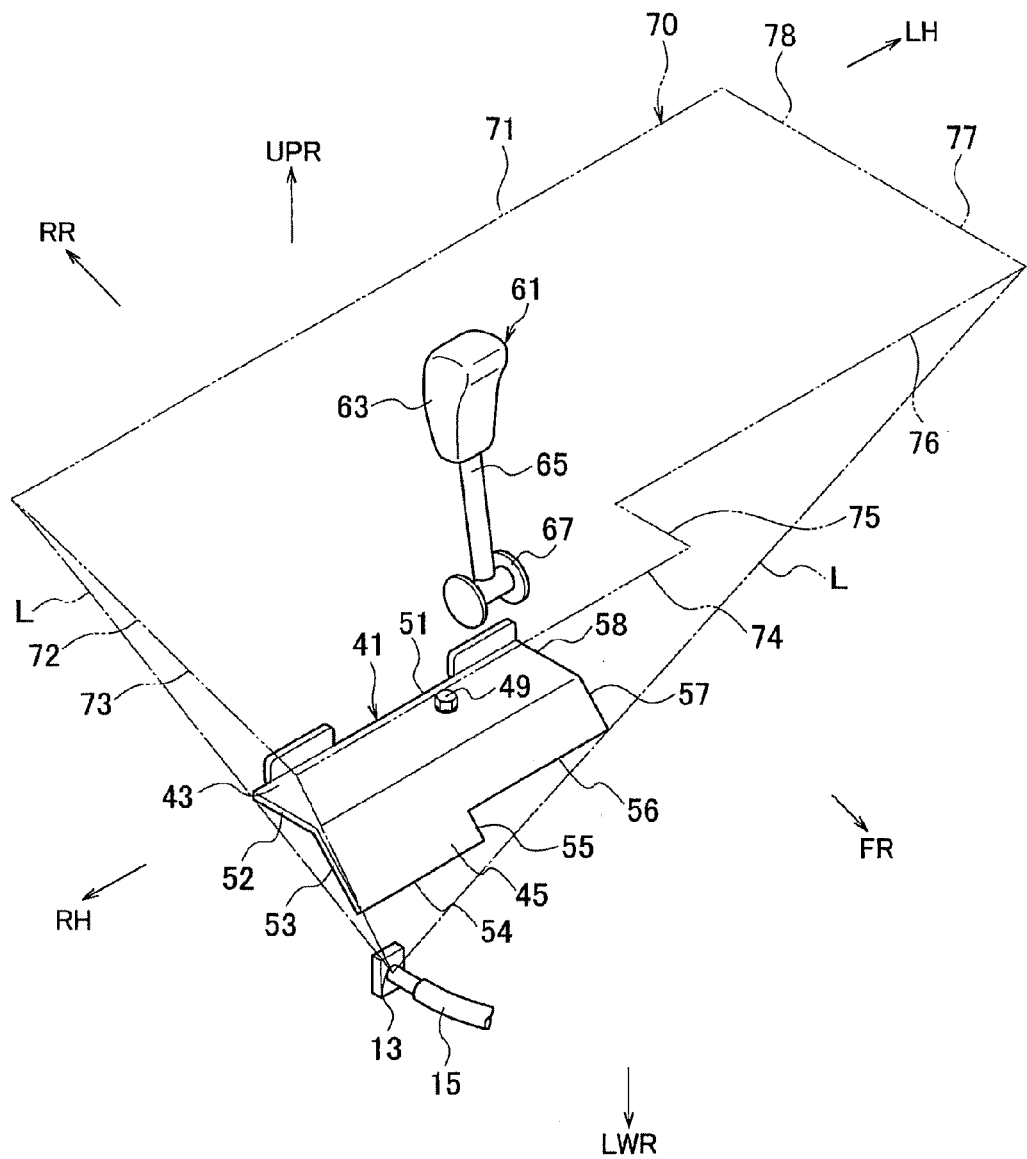
FIG. 3 is a perspective view of an electromagnetic wave radiating portion, a shielding plate, an automatic transmission, and a shield region.

As shown in FIG. 2 and FIG. 3, a metal shielding plate 41 (shielding member) is closely fixed onto the first upper surface 23 of the battery 19. The shielding plate 41 is made of metal and connected to a body ground as described below, so as to function as a shield against electromagnetic waves. The shielding plate 41 is an integrated member including a body 43 elongated in the front-rear direction and the right-left direction, an extending part 45 bent and extending downward from the front edge of the body 43, and a pair of flanges 47 bent and extending upward on both sides at the rear edge of the body 43. The extending part 45 has a long part extending in the front-rear direction on the right side and a short part extending in the front-rear direction on the left side. The shielding plate 41 is fastened onto the first upper surface 23 of the battery 19 with a bolt 49, so that the shielding plate 41 is grounded to the battery 19. As shown in FIG. 3, the shielding plate 41 has a circumferential edge including a first edge 51 located at the rear edge of the body 43, a second edge 52 located at the right edge of the body 43, a third edge 53 located at the right edge of the extending part 45, a fourth edge 54 located at the front edge on the right side of the extending part 45, a fifth edge 55 extending backward from the left corner of the fourth edge 54, a sixth edge 56 located at the front edge on the left side of the extending part 45, a seventh edge 57 located at the left edge on the left side of the extending part 45, and an eighth edge 58 located at the left edge of the body 43.

Figure 4:
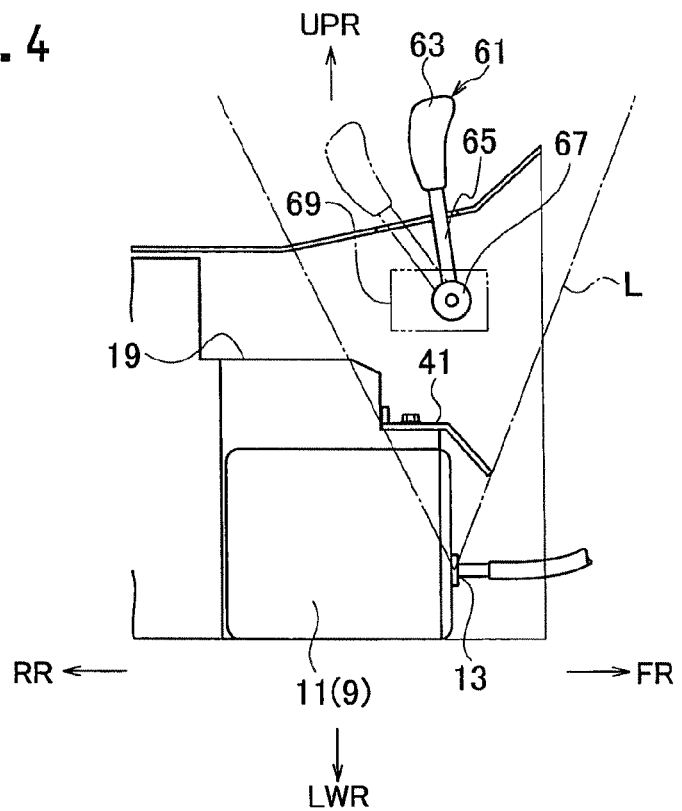
FIG. 4 is a side view of FIG. 2 as viewed from the side of the vehicle.
Figure 5:
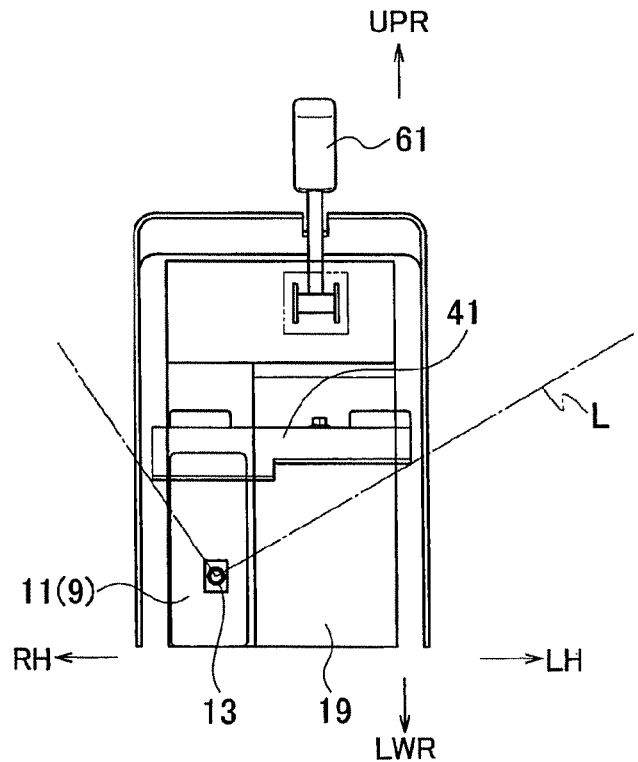
FIG. 5 is a front view of FIG. 2 as viewed from the front of the vehicle.

As shown in FIG. 3 to FIG. 5, the opening 13 of the casing 11 serving as an electromagnetic wave radiating portion is provided immediately below the shielding plate 41 on the right side of the extending part 45. Namely, the extending part 45 of the shielding plate 41 covers the upper side of the opening 13 of the casing 11 in the vertical direction. An automatic transmission 61 (transmission) is located above the shielding plate 41. The automatic transmission 61 includes a knob 63 which a driver holds, a metal lever 65 (metal member) extending downward from the knob 63, a support 67 provided at the bottom of the lever 65, and a box 69 housing and holding the support 67. The lever 65 is a metal member that receives electromagnetic waves and transmits the electromagnetic waves to the passenger compartment. Although one or more of the above embodiments exemplifies the automatic transmission 61, a manual transmission may also be applicable.

The electromagnetic waves radiated from the opening 13 (electromagnetic wave radiating portion) of the casing 11 of the DC/DC converter 9 are not transmitted to a shield region 70 shown in FIG. 3. The shield region 70 is defined such that the opening 13 serving as an electromagnetic wave radiating portion is connected to the circumferential edge of the shielding plate 41 via a line L, and the line L is continuously moved along the circumferential edge of the shielding plate 41 around the electromagnetic wave radiating portion. More particularly, the line L is continuously moved along the first edge 51 of the shielding plate 41 to define a first edge 71 of the shield region 70, and further moved along the second edge 52 to define a second edge 72 of the shield region 70. Similarly, the line L is moved along the third edge 53 to define a third edge 73, moved along the fourth edge 54 to define a fourth edge 74, and moved along the fifth edge 55 to define a fifth edge 75. Further, the Line L is moved along the sixth edge 56 to define a sixth edge 76, moved along the seventh edge 57 to define a seventh edge 77, and moved along the eighth edge 58 to define an eighth edge 78. The circumferential edge of the shield region 70 at an intermediate portion in the vertical direction is thus defined by the first edge 71 to the eighth edge 78. More particularly, the lowermost portion of the shield region 70 is located at the same level as the height of the shielding plate 41, the intermediate portion of the shield region 70 is defined by the first edge 71 to the eighth edge 78, and the sides of the shield region 70 are defined by the continuous movement of the line L. The uppermost portion of the shield region 70 is not defined because the electromagnetic waves are transmitted radially.

The automatic transmission 61 is arranged above the shielding plate 41 in the shield region 70.

Figure 6:
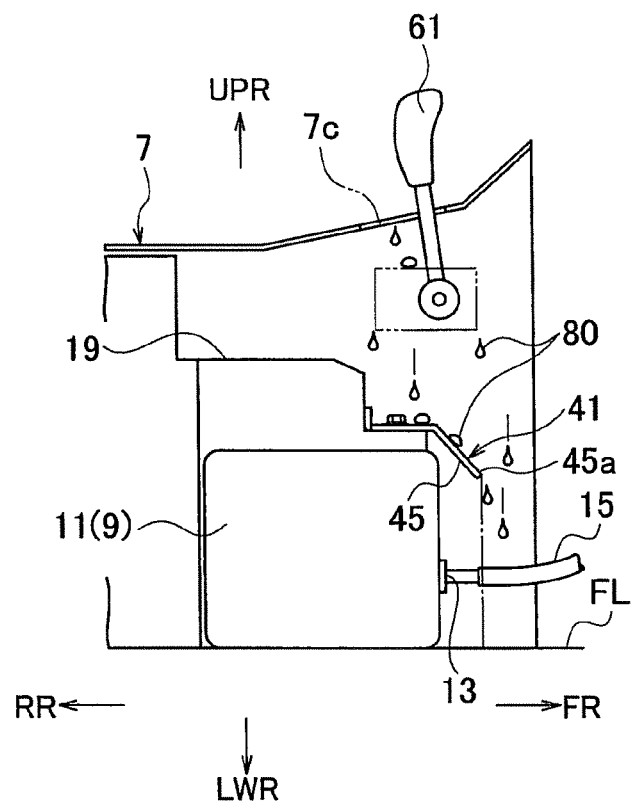
FIG. 6 is a side view showing a state in which drops of water fall into the console through a lever hole provided on the console.

As shown in FIG. 6, the shielding plate 41 also functions to protect the opening 13 of the casing 11 of the DC/DC converter 9 from drops of water 80. As described above with reference to FIG. 2, the lever hole 7c is formed on the upper wall 7b of the console 7. A cup holder (not shown) is provided at the upper wall 7b of the console 7. When a drink cup placed in the cup holder leans and the drops 80 of a drink enter the console 7 through the lever hole 7c, the drops 80 come into contact with the shielding plate 41 and fall downward from a front edge 45a of the extending part 45 toward a floor FL, as indicated by the dash-dotted line in FIG. 6. Accordingly, the periphery of the opening 13 of the casing 11 can be prevented from being wetted.

Although one or more of the above embodiments exemplifies the DC/DC converter 9 as an electrical instrument, a DC/AC converter may be used instead.

Possible advantages of one or more embodiments of the present invention are described below.

(1) One or more embodiments of the present invention relates to an electromagnetic wave shielding structure of the console 7 installed in the passenger compartment of the vehicle 1.

The electromagnetic wave shielding structure includes the DC/DC converter 9 (electrical instrument) installed in the console 7 from which electromagnetic waves are radiated, the automatic transmission 61 (transmission) including the lever 65 (metal member) that receives the electromagnetic waves and transmits the electromagnetic waves to the passenger compartment and separated by a distance from the DC/DC converter 9, and the shielding plate 41 (shielding member) located between the DC/DC converter 9 and the automatic transmission 61 to function as a shield against the electromagnetic waves radiated from the DC/DC converter 9. The automatic transmission 61 is located in the shield region 70 defined such that the opening 13 (electromagnetic wave radiating portion) provided at the DC/DC converter 9 from which the electromagnetic waves are radiated is connected to the circumferential edge of the shielding plate 41 via the line L, and the line L is continuously moved along the circumferential edge of the shielding plate 41 around the opening 13.

The electromagnetic waves are radially transmitted from the electromagnetic wave radiating portion of the electrical instrument. If the shielding plate 41 is not provided, the electromagnetic waves radiated from the electromagnetic wave radiating portion of the DC/DC converter 9 are transmitted to the passenger compartment via the lever 65 of the automatic transmission 61, which may cause faults such as noise of a radio.

One or more embodiments of the present invention thus provides the shielding plate 41 between the DC/DC converter 9 and the automatic transmission 61. Further, the automatic transmission 61 is located in the shield region 70 defined such that the line L, which connects the electromagnetic wave radiating portion and the circumferential edge of the shielding plate 41, is continuously moved along the circumferential edge of the shielding plate 41. Since the shield region 70 is shielded from the electromagnetic waves, the radiation of the electromagnetic waves via the automatic transmission 61 toward the passenger compartment can be prevented efficiently when the automatic transmission 61 is located in the shield region 70. Accordingly, the possibility of arrangement of the electrical instrument radiating the electromagnetic waves can be expanded.

(2) The shielding member is formed of the shielding plate 41, the DC/DC converter 9 is installed at the bottom in the console 7, the automatic transmission 61 is located above the DC/DC converter 9, the shielding plate 41 is placed between the DC/DC converter 9 and the automatic transmission 61 in the vertical direction, the shielding plate 41 includes the body 43 elongated in the front-rear direction and the right-left direction and the extending part 45 bent and extending obliquely downward at the edge of the body 43, and the extending part 45 covers the opening 13 of the DC/DC converter 9.

The extending part 45 of the shielding plate 41 covers the opening 13 of the DC/DC converter 9. Thus, the shielding plate 41 can more efficiently shield the automatic transmission 61 against the electromagnetic waves radiated from the opening 13 serving as an electromagnetic wave radiating portion.

The extending part 45 of the shielding plate 41 is bent and extends obliquely downward. The drops 80 falling down from the upper portion of the console 7 can efficiently be drained downward along the shielding plate 41. The shielding plate 41 can thus efficiently protect the opening 13 of the DC/DC converter 9 from the drops 80.

(3) The shielding plate 41 is arranged immediately above the opening 13 (electromagnetic radiating portion) of the DC/DC converter 9 so as to cover the opening 13.

The shielding plate 41 thus accurately shields the automatic transmission 61 against the electromagnetic waves radiated from the opening 13.

The shielding plate 41 can also protect the opening 13 of the DC/DC converter 9 from the drops 80 falling down from the upper side of the console 7.

(4) The shielding plate 41 (shielding member) is connected to a body ground.

The shielding plate 41, which is required to be grounded, is not necessarily provided with a dedicated ground cable because the shielding plate 41 is connected to the body ground. Accordingly, the ground can be implemented at low cost, and the working process of grounding can be simplified.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

REFERENCE SIGNS LIST

7 CONSOLE
9 DC/DC CONVERTER (ELECTRICAL INSTRUMENT)
13 OPENING (ELECTROMAGNETIC WAVE RADIATING PORTION)
41 SHIELDING PLATE (SHIELDING MEMBER)
43 BODY
45 EXTENDING PART
51 FIRST EDGE (CIRCUMFERENTIAL EDGE)
52 SECOND EDGE (CIRCUMFERENTIAL EDGE)
53 THIRD EDGE (CIRCUMFERENTIAL EDGE)
54 FOURTH EDGE (CIRCUMFERENTIAL EDGE)
55 FIFTH EDGE (CIRCUMFERENTIAL EDGE)
56 SIXTH EDGE (CIRCUMFERENTIAL EDGE)
57 SEVENTH EDGE (CIRCUMFERENTIAL EDGE)
58 EIGHT EDGE (CIRCUMFERENTIAL EDGE)
61 AUTOMATIC TRANSMISSION (TRANSMISSION)
65 LEVER (METAL MEMBER)
70 SHIELD REGION

The invention claimed is:

1. An electromagnetic wave shielding structure of a console installed in a passenger compartment of a vehicle comprising:
   an electrical instrument installed in the console from which electromagnetic waves are radiated;
   a transmission including a metal member that receives the electromagnetic waves and transmits the electromagnetic waves to the passenger compartment and separated by a distance from the electrical instrument; and
   a shielding member located between the electrical instrument and the transmission to function as a shield against the electromagnetic waves radiated from the electrical instrument,
   wherein the transmission is located in a shield region defined such that an electromagnetic wave radiating portion provided at the electrical instrument from which the electromagnetic waves are radiated is connected to a circumferential edge of the shielding member via a straight line, and the line is continuously moved along the circumferential edge of the shielding member around the electromagnetic wave radiating portion.

2. The electromagnetic wave shielding structure of the console installed in the passenger compartment of the vehicle according to claim 1, wherein the shielding member is formed of a shielding plate;

wherein the electrical instrument is installed at a bottom in the console, the transmission is provided above the electrical instrument, and the shielding plate is located between the electrical instrument and the transmission in a vertical direction;

wherein the shielding plate includes a body elongated in a front-rear direction and a right-left direction, and an extending part bent and extending obliquely downward at an edge of the body; and wherein the extending part is arranged to cover the electromagnetic wave radiating portion of the electrical instrument.

3. The electromagnetic wave shielding structure of the console installed in the passenger compartment of the vehicle according to claim 2, wherein the shielding plate is located immediately above the electromagnetic wave radiating portion of the electrical instrument so as to cover the electromagnetic wave radiating portion.

4. The electromagnetic wave shielding structure of the console installed in the passenger compartment of the vehicle according to claim 1, wherein the shielding member is connected to a body ground.

5. The electromagnetic wave shielding structure of the console installed in the passenger compartment of the vehicle according to claim 2, wherein the shielding member is connected to a body ground.

6. The electromagnetic wave shielding structure of the console installed in the passenger compartment of the vehicle according to claim 3, wherein the shielding member is connected to a body ground.

* * * * *